(12) United States Patent
Huang et al.

(10) Patent No.: US 11,978,729 B2
(45) Date of Patent: May 7, 2024

(54) SEMICONDUCTOR DEVICE PACKAGE HAVING WARPAGE CONTROL AND METHOD OF FORMING THE SAME

(71) Applicant: Taiwan Semiconductor Manufacturing Company, Ltd., Hsinchu (TW)

(72) Inventors: Heh-Chang Huang, Hsinchu (TW); Fu-Jen Li, Hsinchu (TW); Pei-Haw Tsao, Tai-chung (TW); Shyue-Ter Leu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/370,282

(22) Filed: Jul. 8, 2021

(65) Prior Publication Data
US 2023/0012350 A1 Jan. 12, 2023

(51) Int. Cl.
*H01L 25/16* (2023.01)
*H01L 21/56* (2006.01)
(Continued)

(52) U.S. Cl.
CPC ............ *H01L 25/16* (2013.01); *H01L 21/563* (2013.01); *H01L 23/3135* (2013.01);
(Continued)

(58) Field of Classification Search
None
See application file for complete search history.

(56) References Cited

U.S. PATENT DOCUMENTS 9,461,355 B2 * 10/2016 Nair .................. H01L 23/66
9,780,074 B2 * 10/2017 Kim .................. H01L 23/49811
(Continued)

FOREIGN PATENT DOCUMENTS

CN      106486383 A  *  3/2017    ......... H01L 21/4825
CN      107424975 A  * 12/2017    ......... H01L 21/4853
(Continued)

OTHER PUBLICATIONS

TW Office Action dated Nov. 17, 2022 in Taiwan application No. 111110537.

*Primary Examiner* — Telly D Green
(74) *Attorney, Agent, or Firm* — McClure, Qualey & Rodack, LLP

(57) ABSTRACT

A semiconductor device package and a method of forming the same are provided. The semiconductor device package includes a package substrate having a first surface and a second surface opposite to the first surface. Several integrated devices are bonded to the first surface of the package substrate. A first underfill element is disposed over the first surface and surrounds the integrated devices. A first molding layer is disposed over the first surface and surrounds the integrated devices and the first underfill element. A semiconductor die is bonded to the second surface of the package substrate. A second underfill element is disposed over the second surface and surrounds the semiconductor die. A second molding layer is disposed over the second surface and surrounds the semiconductor die and the second underfill element. Several conductive bumps are disposed over the second surface and adjacent to the second molding layer.

20 Claims, 16 Drawing Sheets

(51) Int. Cl.
*H01L 23/00* (2006.01)
*H01L 23/31* (2006.01)
*H01L 23/498* (2006.01)
*H01L 25/00* (2006.01)

(52) U.S. Cl.
CPC ........ *H01L 23/49816* (2013.01); *H01L 24/16* (2013.01); *H01L 24/32* (2013.01); *H01L 24/73* (2013.01); *H01L 25/50* (2013.01); *H01L 2224/16225* (2013.01); *H01L 2224/32225* (2013.01); *H01L 2224/73203* (2013.01)

(56) References Cited

U.S. PATENT DOCUMENTS

| | | | |
|---|---|---|---|
| 10,128,192 B2 | 11/2018 | Lin et al. | |
| 10,163,853 B2 | 12/2018 | Wei et al. | |
| 10,177,117 B2* | 1/2019 | Bang | H01L 23/36 |
| 10,475,759 B2* | 11/2019 | Jeng | H01L 23/49827 |
| 10,535,597 B2* | 1/2020 | Chen | H01L 21/4803 |
| 10,872,879 B2* | 12/2020 | Kim | H01L 23/31 |
| 10,903,190 B2* | 1/2021 | Kim | H01L 23/3157 |
| 10,985,125 B2 | 4/2021 | Huang et al. | |
| 11,056,470 B2* | 7/2021 | Ng | H01L 21/6835 |
| 11,362,010 B2 | 6/2022 | Lin et al. | |
| 11,488,934 B2* | 11/2022 | Kim | H01L 25/0652 |
| 2007/0178627 A1* | 8/2007 | Jiang | H01L 24/31 438/108 |
| 2013/0087920 A1* | 4/2013 | Jeng | H01L 23/49827 257/773 |
| 2013/0249532 A1* | 9/2013 | Lin | H01L 23/3157 257/774 |
| 2013/0334705 A1 | 12/2013 | Kurita | |
| 2014/0293529 A1* | 10/2014 | Nair | H01L 21/568 257/690 |
| 2016/0233196 A1* | 8/2016 | Kim | H01L 21/6835 |
| 2017/0084576 A1* | 3/2017 | Yu | H01L 21/31053 |
| 2017/0125264 A1* | 5/2017 | Do | H01L 23/49811 |
| 2017/0141007 A1* | 5/2017 | Hsieh | C08G 59/42 |
| 2017/0358560 A1* | 12/2017 | Kim | H01L 23/3157 |
| 2018/0138101 A1* | 5/2018 | Yu | H01L 23/481 |
| 2018/0254260 A1* | 9/2018 | Wei | H01L 25/0652 |
| 2018/0323170 A1* | 11/2018 | Kim | H01L 21/56 |
| 2019/0067104 A1* | 2/2019 | Huang | H01L 24/16 |
| 2019/0131273 A1* | 5/2019 | Chen | H01L 21/568 |
| 2019/0393192 A1* | 12/2019 | Eid | H01L 24/73 |
| 2019/0393193 A1* | 12/2019 | Eid | H01L 25/0652 |
| 2020/0066643 A1* | 2/2020 | Yu | H01L 24/20 |
| 2020/0212018 A1* | 7/2020 | Lai | H01L 23/3121 |
| 2020/0343220 A1* | 10/2020 | Chen | H01L 25/0652 |
| 2020/0365558 A1* | 11/2020 | Lee | H01L 24/08 |
| 2020/0402965 A1* | 12/2020 | Ng | H01L 24/81 |
| 2021/0217725 A1* | 7/2021 | Kim | H01L 23/552 |
| 2021/0327864 A1* | 10/2021 | Buot | H01G 4/40 |
| 2021/0391314 A1* | 12/2021 | Jeng | H01L 24/16 |

FOREIGN PATENT DOCUMENTS

| | | | |
|---|---|---|---|
| KR | 20140078915 A | * | 6/2014 |
| KR | 20170120257 A | * | 10/2017 |
| KR | 20200033131 A | * | 3/2020 |
| KR | 20200090093 A | * | 7/2020 |
| TW | 201737431 A | | 10/2017 |
| TW | 201804542 A | | 2/2018 |
| TW | 201947711 A | | 12/2019 |
| TW | 202117869 A | | 5/2021 |

* cited by examiner

SEMICONDUCTOR DEVICE PACKAGE HAVING WARPAGE CONTROL AND METHOD OF FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules (MCM), for example, or in other types of packaging.

A package structure not only provides protection for semiconductor devices from environmental contaminants, but also provides a connection interface for the semiconductor devices packaged therein. Smaller package structures, which utilize less area or are lower in height, have been developed to package the semiconductor devices.

Although existing package structures and methods for fabricating package structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
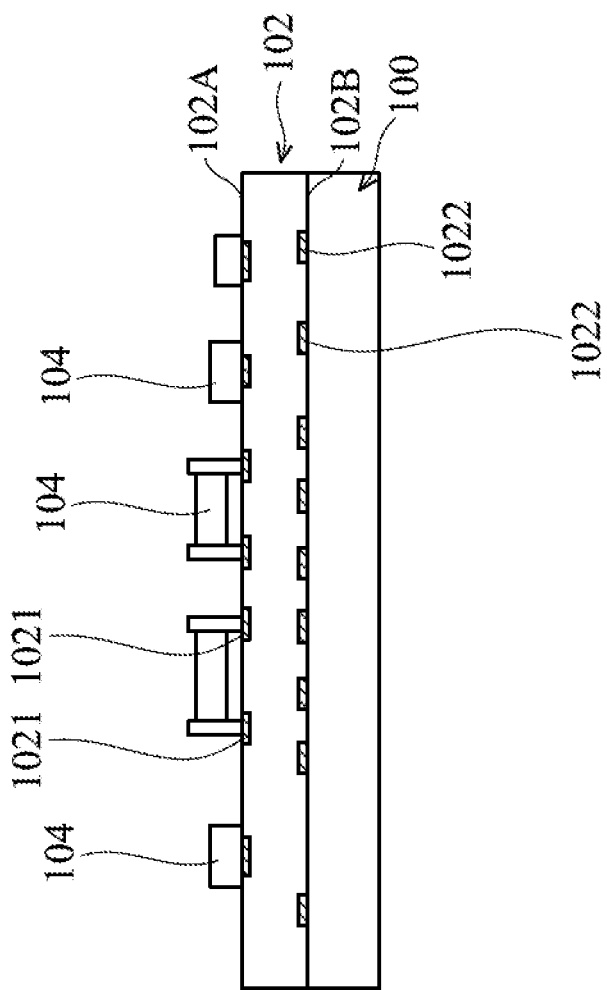
FIGS. 1A-1G are cross-sectional views of various stages of a process for forming a semiconductor device package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g., a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

A semiconductor device package (structure) including warpage control and the method for forming the same are provided in accordance with various embodiments of the disclosure. The intermediate stages in the formation of the semiconductor device package are illustrated in accordance with some embodiments. Some variations of some embodiments are discussed. Throughout the various views and illustrative embodiments, like reference numbers are used to designate like elements. In accordance with some embodiments, a semiconductor device package includes underfill elements and molding layers on both sides of a package substrate so as to reduce warpage and avoid delamination at the bonding interface between the package substrate and the devices thereon. Accordingly, the reliability of the semiconductor device package is improved.

Embodiments herein may be described in a specific context, namely a system-in-package (SIP) that includes one or more functional semiconductor dies (also called chips) and passive devices integrated on opposite sides of a package substrate. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may also be performed in any logical order.

FIGS. 1A-1G illustrate cross-sectional views of intermediate stages in the formation of a semiconductor device package in accordance with some embodiments of the disclosure. As shown in FIG. 1A, a carrier substrate 100 is provided, in accordance with some embodiments. The carrier substrate 100 may be configured to provide temporary mechanical and structural support for the processing of build-up layers or structures during subsequent processing steps. In some embodiments, the materials of the carrier substrate 100 include glass, silicon, silicon oxide, aluminum oxide, metal, a combination thereof, and/or the like. In some other embodiments, the carrier substrate 100 includes a metal frame.

As shown in FIG. 1A, a package substrate 102 is disposed over the carrier substrate 100, in accordance with some embodiments. The package substrate 102 may be configured to provide electrical connection between devices packaged in the package structure and an external electronic device such as a printed circuit board (PCB), which will be further described later. In some embodiments, the package substrate 102 is a core or core-less wiring substrate. The core layer (not shown) of the package substrate 102 may be made of or include a fiber material, a polymer material, a semiconductor material, a glass material, a metal material, or another suitable material. One or more interconnect structure layers may also be formed on one or both sides of the core layer to facilitate routing. In some embodiments, the package substrate 102 includes a printed circuit board (PCB), a ceramic substrate, or the like.

In some other embodiments, the package substrate 102 includes a semiconductor substrate, which may be a bulk semiconductor substrate, a silicon-on-insulator (SOI) substrate, a germanium-on-insulator (GOI) substrate, or the like. The semiconductor materials of the substrate may include silicon, germanium; a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The package substrate 102 may be doped or undoped.

In some embodiments, the package substrate 102 is an interposer substrate which is free from active devices (e.g., transistors and diodes) and passive devices (e.g., resistors, capacitors, inductors, or the like) therein. In some alternative embodiments, the package substrate 102 is a device substrate which includes active and/or passive devices therein.

In some embodiments, the package substrate 102 has two opposite and parallel surfaces 102A and 102B, as shown in FIG. 1A. The surface 102B faces the carrier substrate 100. Contact pads 1021 are formed on or exposed from the surface 102A, and may be used to electrically connect to the subsequently attached package components (which will be described later). Contact pads 1022 are formed on or exposed from the surface 102B, and may be used to electrically connect to the subsequently attached package components (which will be described later). Although not shown, the package substrate 102 also includes conductive lines (e.g., vias and/or traces) therein to interconnect the contact pads 1021 and 1022. The conductive lines and the contact pads 1021 and 1022 may be made of or include a conductive material, such as metal (e.g. copper, aluminum, or tungsten). The formation method of the above package substrate 102 is well known in the art and therefore not described herein.

As shown in FIG. 1A, integrated devices 104 are stacked over the surface 102A of the package substrate 102, in accordance with some embodiments. In some embodiments, the integrated devices 104 are integrated passive devices (IPDs) such as resistors, capacitors, the like, or a combination thereof. In some embodiments, the integrated devices 104 can be of different types and have different heights (or thicknesses). The integrated devices 104 may be placed over the surface 102A using, for example, a pick-and-place tool (not shown). In some embodiments, the integrated devices 104 are bonded to (i.e., electrically interconnected to) the surface 102A through solder elements (e.g., solder pastes, not shown for simplicity). In some embodiments, solder elements may be formed on the terminals of the integrated devices 104, on the contact pads 1021 exposed at the surface 102A, or on both before bonding. A reflow process is then performed to melt the solder elements to form conductive joints, to physically and electrically couple the integrated devices 104 to the package substrate 102.

Figure 1B:
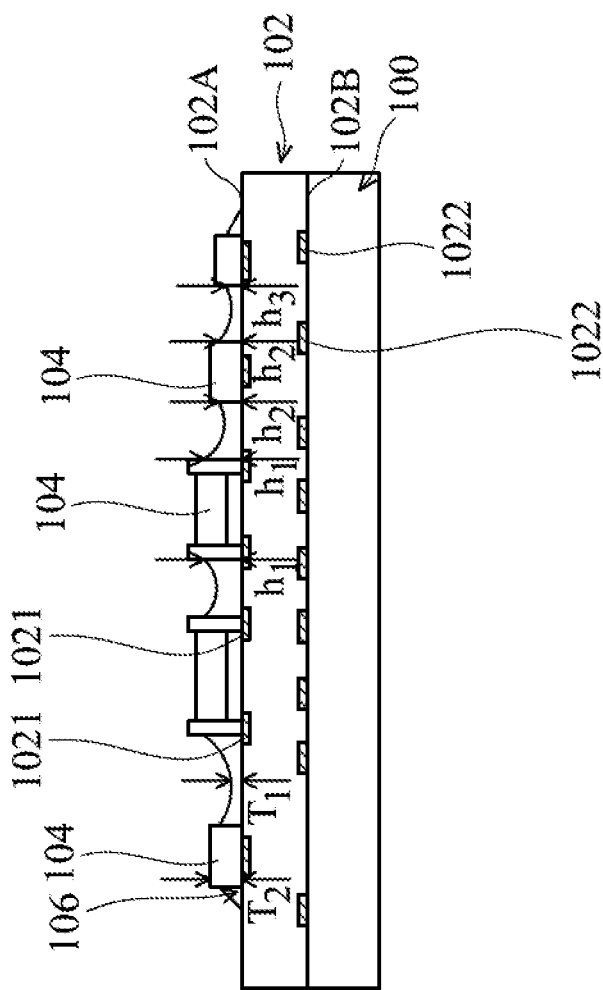

As shown in FIG. 1B, an underfill element 106 is formed over the surface 102A of the package substrate 102 to surround and protect the integrated devices 104 and the conductive joints thereunder, and enhances the connection between the integrated devices 104 and the package substrate 102, in accordance with some embodiments. The underfill element 106 may be made of or include an insulating material such as an underfill material. The underfill material may include an epoxy, a resin, a filler material, a stress release agent (SRA), an adhesion promoter, another suitable material, or a combination thereof. In some embodiments, an underfill material in liquid state is dispensed into the gap between each integrated device 104 and the package substrate 102 and/or the gap between adjacent integrated devices 104 to reinforce the strength of the conductive joints and therefore the overall package structure. After the dispensing, the underfill material is cured (for example by heating or ultraviolet (UV) radiation) to form the underfill element 106, in accordance with some embodiments.

In some embodiments, a thickness $T_1$ of the underfill element 106 (such as from the surface 102A to the top surface of the underfill element 106 in a direction perpendicular to the surface 102A) is about ⅓ to about ½ of a thickness $T_2$ of the integrated device 104 (such as from the surface 102A to the top surface of the integrated device 104 in the direction perpendicular to the surface 102A), as shown in FIG. 1B. However, other thickness values or ranges may also be used.

In some embodiments, the thicker the integrated device 104, the thicker the part of underfill element 106 that surrounds and contacts that integrated device 104 (for example thickness h1>thickness h2>thickness h3), as shown in FIG. 1B. For example, there is a portion of the underfill element 106 between two integrated devices 104 with different thicknesses, and the part of the underfill element 106 in contact with the thicker integrated device 104 has a larger thickness than the part of the underfill element 106 in contact with the thinner integrated device 104. This can be achieved by precisely controlling the amount of dispensed underfill material, and this can improve the reliability of the package by increasing the adhesion of the integrated devices 104 on the package substrate 102.

Figure 1C:
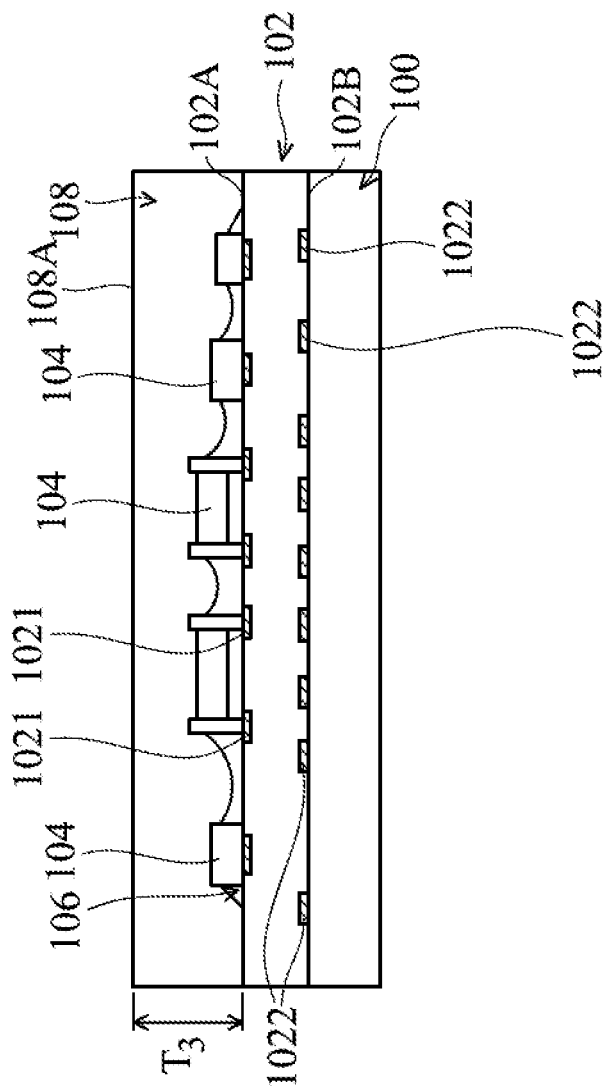

As shown in FIG. 1C, a molding layer 108 is formed over the surface 102A of the package substrate 102 to encapsulate and protect the integrated devices 104 and the underfill element 106, in accordance with some embodiments. The molding layer 108 may be separated from the conductive joints below the integrated devices 104 by the underfill element 106. In some embodiments, the molding layer 108 is made of or includes an insulating material such as a molding material. The molding material may include a polymer material, such as an epoxy-based resin with fillers dispersed therein. In some embodiments, a molding material (such as a liquid molding material) is dispensed using, for example, injection molding over the package substrate 102, the integrated devices 104, and the underfill element 106. In some embodiments, a thermal process is then used to cure the liquid molding material and to transform it into the molding layer 108. In some embodiments, the molding layer 108 extends laterally to the lateral edges of the package substrate 102.

Because there is a coefficient of thermal expansion (CTE) mismatch between the package substrate 102 and the components or other materials thereon, the warpage of the package substrate 102 occurs during the molding process of the molding layer 108, such as during thermal stress. The bending can cause reliability issues, such as delamination at the joint or bonding interface between the integrated devices 104 and the package substrate 102. In some embodiments, the underfill element 106 can further relieve the thermal stress that occurs as a stress or strain on the conductive joints, thereby reducing warpage on the package substrate 102 and avoiding delamination at the bonding interface (such as between the integrated devices 104 and the conductive joints and/or between the package substrate 102 and the conductive joints).

In some embodiments, the underfill element 106 and the molding layer 108 have different thermal and mechanical properties, such as by having different compositions of material. Each of the underfill element 106 and the molding layer 108 can be modified to have particular mechanical and/or thermal properties by adjusting the ratio of filler to epoxy in the respective material used, for example. The filler may be an inorganic material, such as alumina, silica, or the like.

In some embodiments, the underfill element 106 can be relatively compliant for relieving thermal stress, such as by having a Young's modulus lower than about 15 GPa, and the molding layer 108 can have a higher thermal conductivity for heat dissipation, such as by having a coefficient of thermal expansion (CTE) lower than about $25 \times 10^{-6}$. For example, the underfill element 106 can have a higher CTE than the molding layer 108, and the molding layer 108 can have a higher Young's modulus than the underfill element 106. In a specific example, the underfill element 106 has a CTE of $1.73 \times 10^{-5}$ and a Young's modulus of 12 GPa, and the molding layer 108 has a CTE of $1.1 \times 10^{-5}$ and a Young's modulus of 21 Gpa. This can be achieved by the molding layer 108 having a higher filler content than the underfill element 106, in accordance with some embodiments. For example, the filler content of the underfill element 106 may be between about 20% and about 50%, and the filler content of the molding layer 108 may be between about 80% and about 90%. One of ordinary skill in the art will appreciate that the above examples are provided for illustrative purposes, and other values (or ranges) of CTE, Young's modulus, and/or filler content of the underfill element 106 and molding layer 108 may also be used.

In some embodiments, a planarization process is further applied on the molding layer 108 to partially remove the molding layer 108. As a result, a thickness $T_3$ of the molding layer 108 (such as from the surface 102A to the top surface 108A of the molding layer 108 in the direction perpendicular to the surface 102A) is reduced, and the overall package structure is thinner. Also, a substantially planar top surface of the molding layer 108 is achieved, which facilitates subsequent processes. In some embodiments shown in FIG. 1C, the integrated devices 104 are buried or encapsulated in the molding layer 108 after the planarization process. The planarization process may include a grinding process, a chemical mechanical polishing (CMP) process, an etching process, a dry polishing process, one or more other applicable processes, or a combination thereof.

Figure 1D:
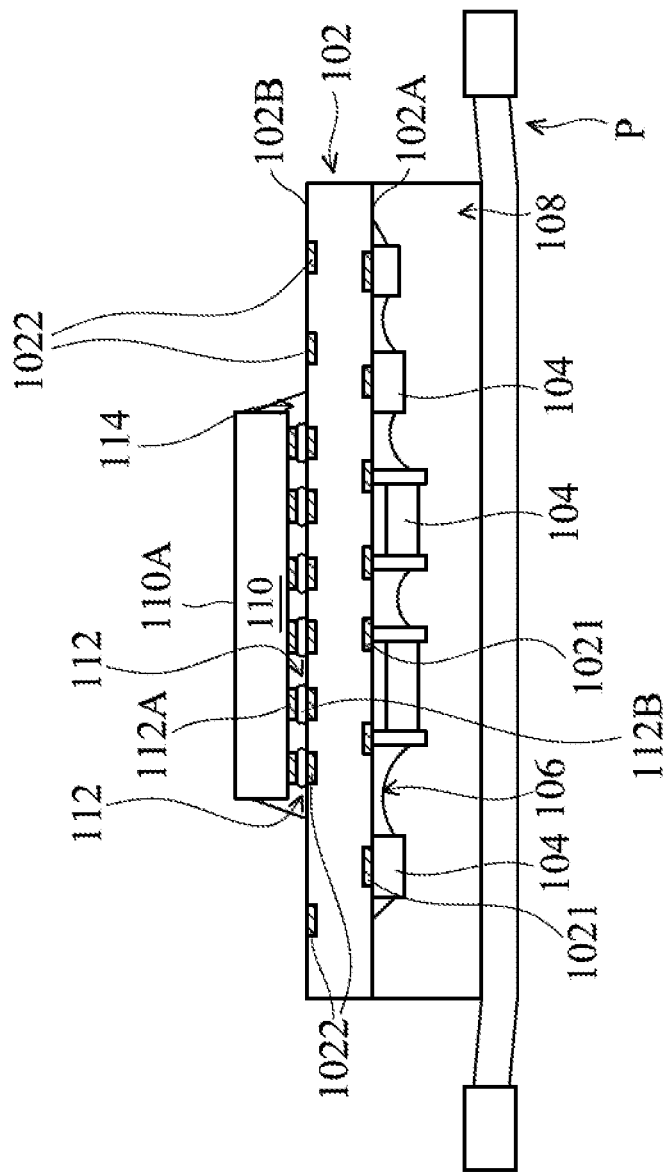

As shown in FIG. 1D, the resulting structure of FIG. 1C is turned upside down and is placed so that the molding layer 108 side is affixed to a dicing tape P, and the carrier substrate 100 originally located on the surface 102B of the package substrate 102 is removed, in accordance with some embodiments. Afterwards, semiconductor dies 110 (for simplicity, only one semiconductor die 110 is depicted) are stacked over the surface 102B of the package substrate 102, in accordance with some embodiments. The semiconductor dies 110 may include logic dies (e.g., central processing unit, graphics processing unit, field-programmable gate array (FPGA), system-on-chip (SOC) dies, microcontroller, or the like), memory dies (e.g., dynamic random access memory (DRAM) dies, static random access memory (SRAM) dies, or the like), power management dies (e.g., power management integrated circuit (PMIC) dies), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. The semiconductor dies 110 may be placed over the surface 102B using, for example, a pick-and-place tool (not shown). In some embodiments shown in FIG. 1D, the semiconductor die 110 is wider than each of the integrated devices 104, and extends laterally across two or more integrated devices 104.

In some embodiments, each semiconductor die 110 is bonded to (i.e., electrically interconnected to) the surface 102B through conductive connectors 112, as shown in FIG. 1D. In some embodiments, each of the conductive connectors 112 includes a metal pillar 112A and a metal cap layer (such as a solder cap) 112B over the metal pillar 112A. The conductive connectors 112 including the metal pillars 112A and the metal cap layers 112B are sometimes referred to as micro bumps. The conductive connectors 112 may be formed on the active surface (such as the lower surface in FIG. 1D) of the semiconductor die 110 at the exposed contact pads (not shown) before bonding. The metal pillars 112A may include a conductive material such as copper, aluminum, gold, nickel, palladium, the like, or a combination thereof, and may be formed by sputtering, printing, electroplating, electroless plating, CVD, or the like. The metal pillars 112A may be solder-free and have substantially vertical sidewalls. In some embodiments, a metal cap layer 112B is formed on the top of a metal pillar 112A. The metal cap layers 112B may include nickel, tin, tin-lead, gold, copper, silver, palladium, indium, nickel-palladium-gold, nickel-gold, the like, or a combination thereof, and may be formed by a plating process such as an electroplating process. One of ordinary skill in the art would appreciate that the above conductive connectors 112 examples are provided for illustrative purposes, and other structures of the conductive connectors 112 may also be used.

The bonding between the semiconductor die 110 and the package substrate 102 may be solder bonding or direct metal-to-metal (such as a copper-to-copper) bonding. In accordance with some embodiments, the semiconductor die 110 is bonded to the package substrate 102 through a reflow process. During the reflow, conductive joints (such as the conductive connectors 112) are in contact with the exposed contact pads (not shown) of the semiconductor die 110 and the exposed contact pads 1022 on the surface 102B of the package substrate 102, respectively, to physically and electrically couple the semiconductor die 110 to the package substrate 102.

As shown in FIG. 1D, an underfill element 114 is formed over the surface 102B of the package substrate 102 to surround and protect the semiconductor die 110 and the conductive connectors 112 thereunder, and enhances the connection between the semiconductor die 110 and the package substrate 102, in accordance with some embodiments. In some embodiments, a portion of the underfill element 114 is between the surface 102B and the active surface of the semiconductor die 110 and fills the gap between adjacent conductive connectors 112, to reinforce the strength of the conductive connectors 112 and therefore the overall package structure. The materials and formation method of the underfill element 114 may be the same as or similar to those of the underfill element 106 illustrated in FIG. 1B, and are not repeated here.

Figure 1E:
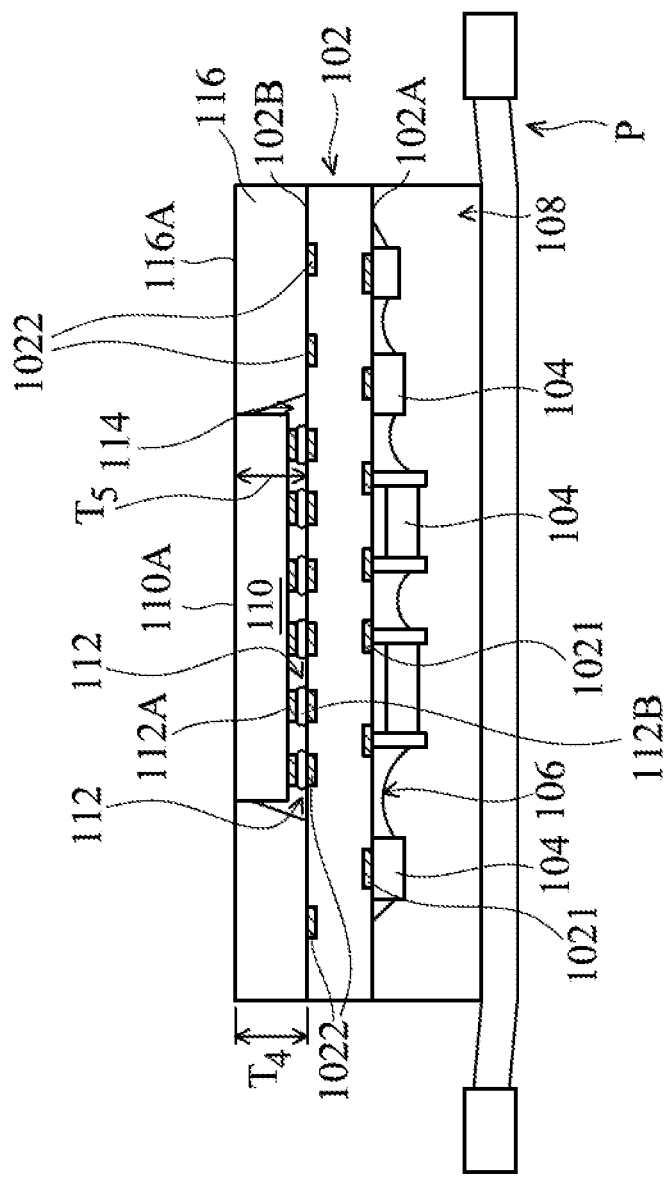

As shown in FIG. 1E, a molding layer 116 is formed over the surface 102B of the package substrate 102 to encapsulate and protect the semiconductor die 110 and the underfill element 114, in accordance with some embodiments. The molding layer 116 may be separated from the conductive connectors 112 below the semiconductor die 110 by the underfill element 114. The materials and formation method of the molding layer 116 may be the same as or similar to those of the molding layer 108 illustrated in FIG. 1C, and are not repeated here. In some embodiments, the molding layer 116 extends laterally to the lateral edges of the package substrate 102, and the lateral edges of the package substrate 102, the molding layer 108, and the molding layer 116 are aligned.

In some embodiments, the underfill element 114 and the molding layer 116 have different thermal and mechanical properties, such as by having different compositions of material. Each of the underfill element 114 and the molding layer 116 can be modified to have particular mechanical and/or thermal properties by adjusting the ratio of filler to epoxy in the respective material used, for example. The filler may be an inorganic material, such as alumina, silica, or the like.

In some embodiments, the underfill element 114 can be relatively compliant for relieving thermal stress, and the molding layer 116 can have a higher thermal conductivity for heat dissipation. In some embodiments, the molding layer 116 has a lower coefficient of thermal expansion than the underfill element 114, a higher Young's modulus than the underfill element 114, a higher filler content percentage than the underfill element 114, or a combination thereof. The values of CTE, Young's modulus, and filler content of the underfill element 114 and the molding layer 116 may be the same as or similar to those of the underfill element 106 and the molding layer 108 described above in some cases, and are not repeated here. However, other values may also be used. In some embodiments, similar to the underfill element 106 previously discussed, the underfill element 114 can further relieve the thermal stress that occurs as a stress or strain on the conductive joints (e.g., conductive connectors 112) during the molding process of the molding layer 116, for example. As a result, the warpage on the package substrate 102 is reduced, cracks in the semiconductor die 110 are avoided, and delamination at the bonding interface (such as between the semiconductor die 110 and the conductive connectors 112 and/or between the package substrate 102 and the conductive connectors 112) is avoided.

In some embodiments, a planarization process is further applied on the molding layer 116 to partially remove the molding layer 116, until the top surface 110A of the semiconductor die 110 is exposed through the molding layer 116 (for example, the top surface 110A is substantially flush with the top surface 116A of the molding layer 116, that is, a thickness $T_4$ of the molding layer 116 (such as from the surface 102B to the top surface 116A of the molding layer 116 in a direction perpendicular to the surface 102B) is substantially equal to a combined thickness $T_5$ of the semiconductor die 110 and the underlying conductive connector 112 (such as from the surface 102B to the top surface 110A of the semiconductor die 110 in the direction perpendicular to the surface 102B)), as shown in FIG. 1E. This facilitates the dissipation of heat generated from the semiconductor die 110 during operation. However, the semiconductor die 110 may also be buried or encapsulated in the molding layer 116 after the planarization process, in some other embodiments. The planarization process may include a grinding process, a chemical mechanical polishing (CMP) process, an etching process, a dry polishing process, one or more other applicable processes, or a combination thereof.

Figure 1F:
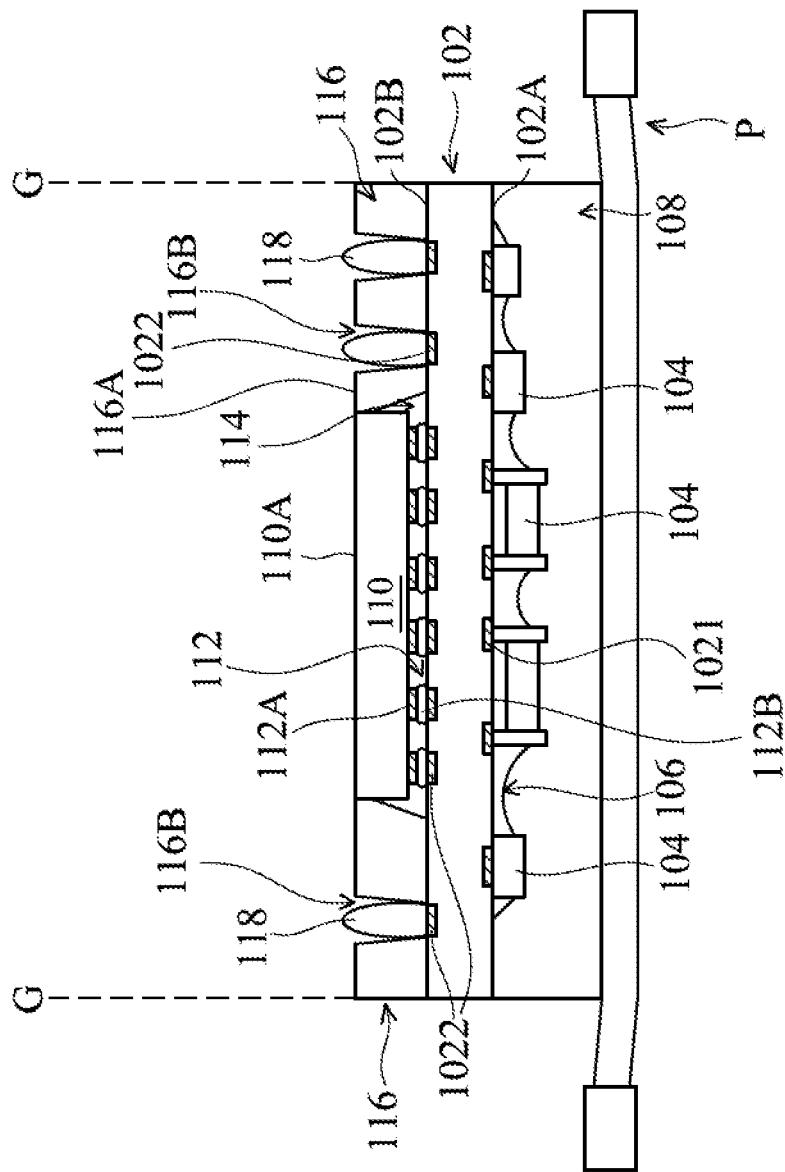

As shown in FIG. 1F, a patterning process is performed to form openings 116B in the molding layer 116 to expose the contact pads 1022 on the surface 102B not occupied by the conductive connectors 112, in accordance with some embodiments. The patterning process may include a photolithography process, an energy beam drilling process (such as a laser beam drilling process, an ion beam drilling process, or an electron beam drilling process), an etching process, a mechanical drilling process, one or more other applicable processes, or a combination thereof.

In some embodiments, solder balls (or solder elements) are then disposed on (such as in direct contact with) the exposed contact pads 1022 in the openings 116B, as shown in FIG. 1F. A reflow process is then carried out to melt the solder balls into the conductive bumps 118. In some other embodiments, under bump metallization (UBM) elements are formed over the exposed contact pads 1022 before the solder balls are disposed. In some other embodiments, solder elements are electroplated onto the exposed contact pads 1022. Afterwards, a reflow process is used to melt the solder element to form the conductive bumps 118. The exposed conductive bumps 118 (sometimes also called ball grid array (BGA)) allow the semiconductor package structure to be bonded and electrically connected to an external PCB or other electronic devices (not shown), in accordance with some embodiments.

Figure 1G:
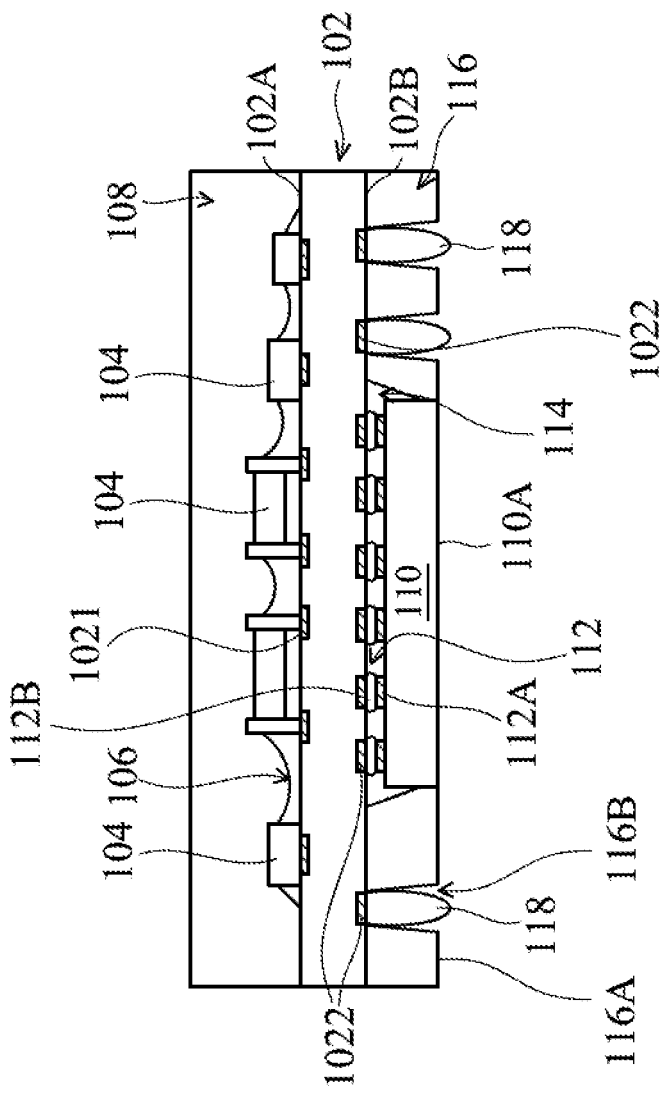

Afterwards, a singulation process (also referred to as a saw process) is performed along cutting grooves G shown in FIG. 1F, to form multiple separate package structures, in accordance with some embodiments. In FIG. 1F, one of the package structures is shown. Each package structure may be removed from the dicing tape P using, for example, a pick-and-place tool (not shown). FIG. 1G illustrates the resulting semiconductor device package after the processes shown in FIGS. 1A to 1F. In FIG. 1G, underfill elements 106 and 114 are formed on both sides of the package substrate 102 to relieve the thermal stress generated during the molding processes of the molding layers 108 and 116, as described above. Accordingly, the warpage on the package substrate 102 and/or the semiconductor die 110 is reduced, and delamination at the bonding interface between the package substrate 102 and the devices packaged thereon is also avoided. Consequently, the reliability of the entire package structure is improved.

Many variations and/or modifications can be made to embodiments of the disclosure. FIGS. 2A-2G are cross-sectional views of various stages of a process for forming a semiconductor device package in accordance with some embodiments.

Figure 2A:
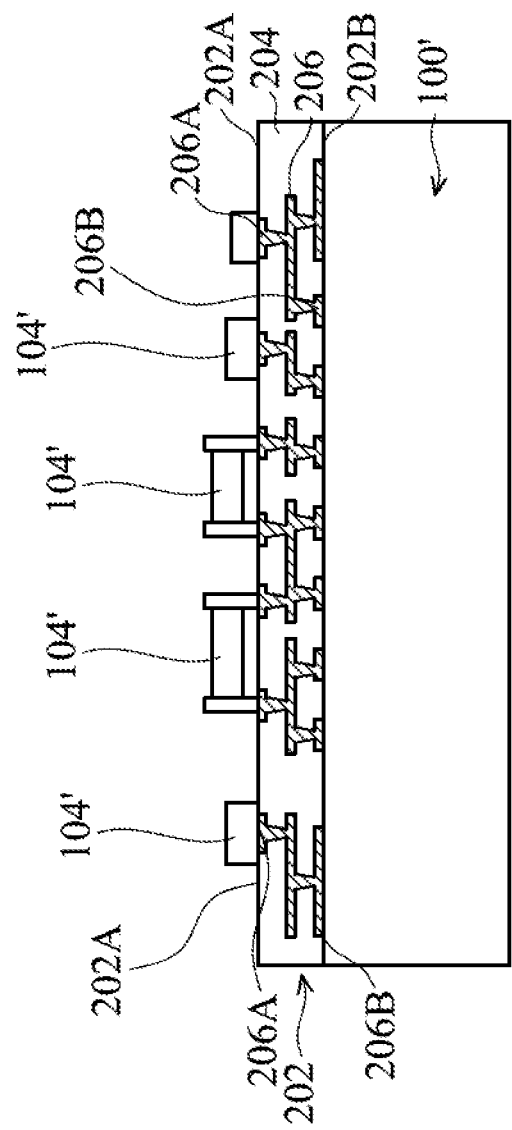
FIGS. 2A-2G are cross-sectional views of various stages of a process for forming a semiconductor device package in accordance with some embodiments.

As shown in FIG. 2A, a package substrate 202 is formed over a carrier substrate 100' (the same as the carrier substrate 100 illustrated in FIG. 1A), in accordance with some embodiments. The package substrate 202 may be configured to provide electrical connection between devices packaged in the package structure and an external electronic device such as a printed circuit board (PCB), which will be further described later.

In some embodiments, the package substrate 202 is a redistribution substrate for routing, which includes multiple laminated insulating layers 204 and multiple conductive features 206 surrounded by the insulating layers 204, as shown in FIG. 2A. The conductive features 206 may include conductive lines providing electrical connection in horizontal directions and conductive vias providing electrical connection in vertical directions. Also, as shown in FIG. 2A, the conductive features 206 include contact pads 206A and 206B formed on or exposed from opposite surfaces 202A and 202B of the package substrate 202 to allow the electrical connection between the package substrate 202 and the subsequently attached package components (which will be described later). The surface 202B faces the carrier substrate 100'.

The insulating layers 204 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 204.

In some other embodiments, some or all of the insulating layers 204 are made of or include dielectric materials other than polymer materials. The dielectric material may include silicon oxide, silicon carbide, silicon nitride, silicon oxynitride, one or more other suitable materials, or a combination thereof.

The conductive features 206 may be made of or include copper, aluminum, gold, cobalt, titanium, nickel, silver, graphene, one or more other suitable conductive materials, or a combination thereof. In some embodiments, the conductive features 206 include multiple sub-layers. For example, each of the conductive features 206 contains multiple sub-layers including Ti/Cu, Ti/Ni/Cu, Ti/Cu/Ti, Al/Ti/Ni/Ag, other suitable sub-layers, or a combination thereof.

The formation of the above package substrate 202 may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

As shown in FIG. 2A, after forming the package substrate 202, integrated devices 104' are stacked over and bonded to the surface 202A of the package substrate 202, in accordance with some embodiments. In some embodiments, the integrated devices 104' are integrated passive devices (IPDs) such as resistors, capacitors, the like, or a combination thereof. The bonding method of the integrated devices 104' may be the same as or similar to that of the integrated devices 104 illustrated in FIG. 1A, and are not repeated here.

Figure 2B:
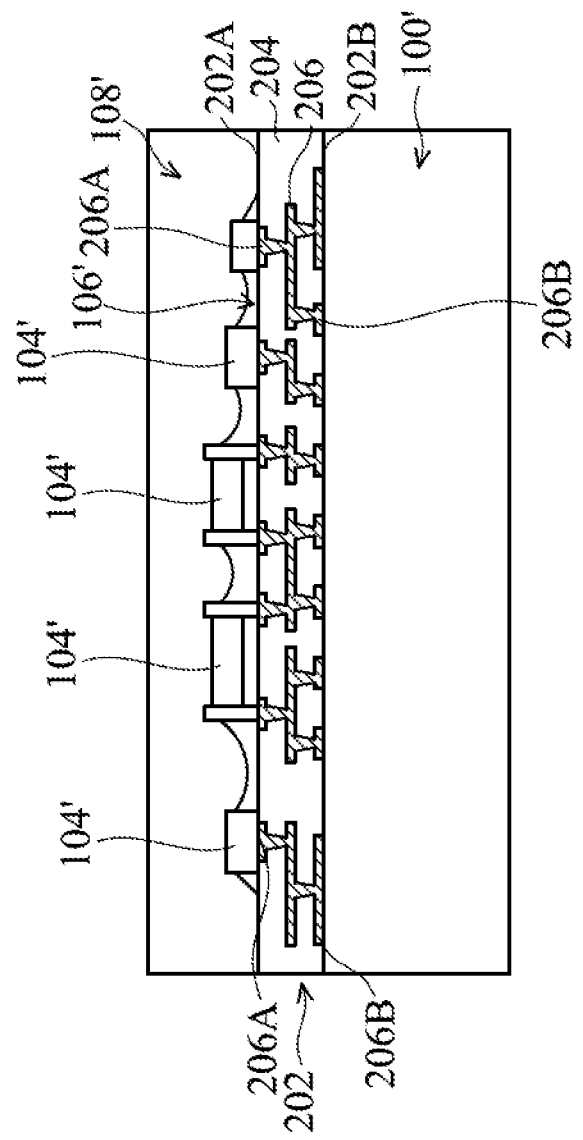

As shown in FIG. 2B, similar to the embodiments illustrated in FIG. 1B, an underfill element 106' is formed over the surface 202A of the package substrate 202 to surround and protect the integrated devices 104' and the conductive joints thereunder, and enhances the connection between the integrated devices 104' and the package substrate 202, in accordance with some embodiments. The materials, structure, and formation method of the underfill element 106' may be the same as or similar to those of the underfill element 106 illustrated in FIG. 1B, and are not repeated here.

As shown in FIG. 2B, similar to the embodiments illustrated in FIG. 1C, a molding layer 108' is formed over the surface 202A of the package substrate 202 to encapsulate and protect the integrated devices 104' and the underfill element 106', in accordance with some embodiments. The molding layer 108' may be separated from the conductive joints below the integrated devices 104' by the underfill element 106'. The materials, structure, and formation method of the molding layer 108' may be the same as or similar to those of the molding layer 108 illustrated in FIG. 1C, and are not repeated here. In some embodiments, the molding layer 108' extends laterally to the lateral edges of the package substrate 202.

In some embodiments, the underfill element 106' and the molding layer 108' have different thermal and mechanical properties, such as by having different compositions of material. Each of the underfill element 106' and the molding layer 108' can be modified to have particular mechanical and/or thermal properties by adjusting the ratio of filler to epoxy in the respective material used, for example. The filler may be an inorganic material, such as alumina, silica, or the like.

In some embodiments, the underfill element 106' can be relatively compliant for relieving thermal stress, and the molding layer 108' can have a higher thermal conductivity for heat dissipation. In some embodiments, the molding layer 108' has a lower coefficient of thermal expansion than the underfill element 106', a higher Young's modulus than the underfill element 106', a higher filler content percentage than the underfill element 106', or a combination thereof. The values of CTE, Young's modulus, and filler content of the underfill element 106' and the molding layer 108' may be the same as or similar to those of the underfill element 106 and the molding layer 108 as described above, and are not repeated here. However, other values may also be used. In some embodiments, similar to the underfill element 106 previously discussed, the underfill element 106' can further relieve the thermal stress that occurs as a stress or strain on the conductive joints, thereby reducing warpage on the package substrate 202 and avoiding delamination at the bonding interface (such as between the integrated devices 104' and the conductive joints and/or between the package substrate 202 and the conductive joints).

In some embodiments, a planarization process is further applied on the molding layer 108' to thin the molding layer 108', similar to the embodiments illustrated in FIG. 1C. In some embodiments, the integrated devices 104' are buried or encapsulated in the molding layer 108' after the planarization process, as shown in FIG. 2B. The planarization process may include a grinding process, a chemical mechanical polishing (CMP) process, an etching process, a dry polishing process, one or more other applicable processes, or a combination thereof.

Figure 2C:
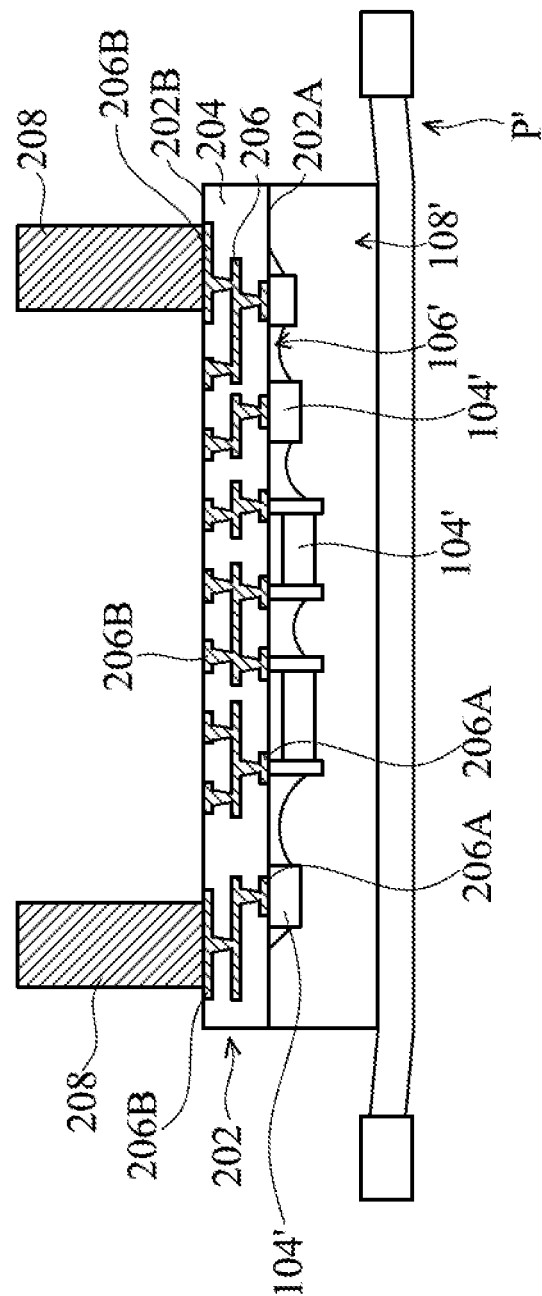

As shown in FIG. 2C, the resulting structure of FIG. 2B is turned upside down and is placed so that the molding layer 108' side is affixed to a dicing tape P', and the carrier substrate 100' originally located on the surface 202B of the package substrate 202 is removed, in accordance with some embodiments. Afterwards, conductive pillars 208 are formed over the surface 202B, in accordance with some embodiments. Each of the conductive pillars 208 may be electrically connected to one contact pad 206B exposed at the surface 202B. In some embodiments, the conductive pillars 208 have vertical sidewalls. The extending direction of the vertical sidewalls may be substantially perpendicular to the surface 202B.

The conductive pillars 208 may be made of or include copper, aluminum, gold, cobalt, titanium, tin, one or more other suitable materials, or a combination thereof. The conductive pillars 208 may be formed using an electroplating process, an electroless plating process, a placement process, a printing process, a physical vapor deposition (PVD) process, a chemical vapor deposition (CVD) process, one or more other applicable processes, or a combination thereof.

Figure 2D:
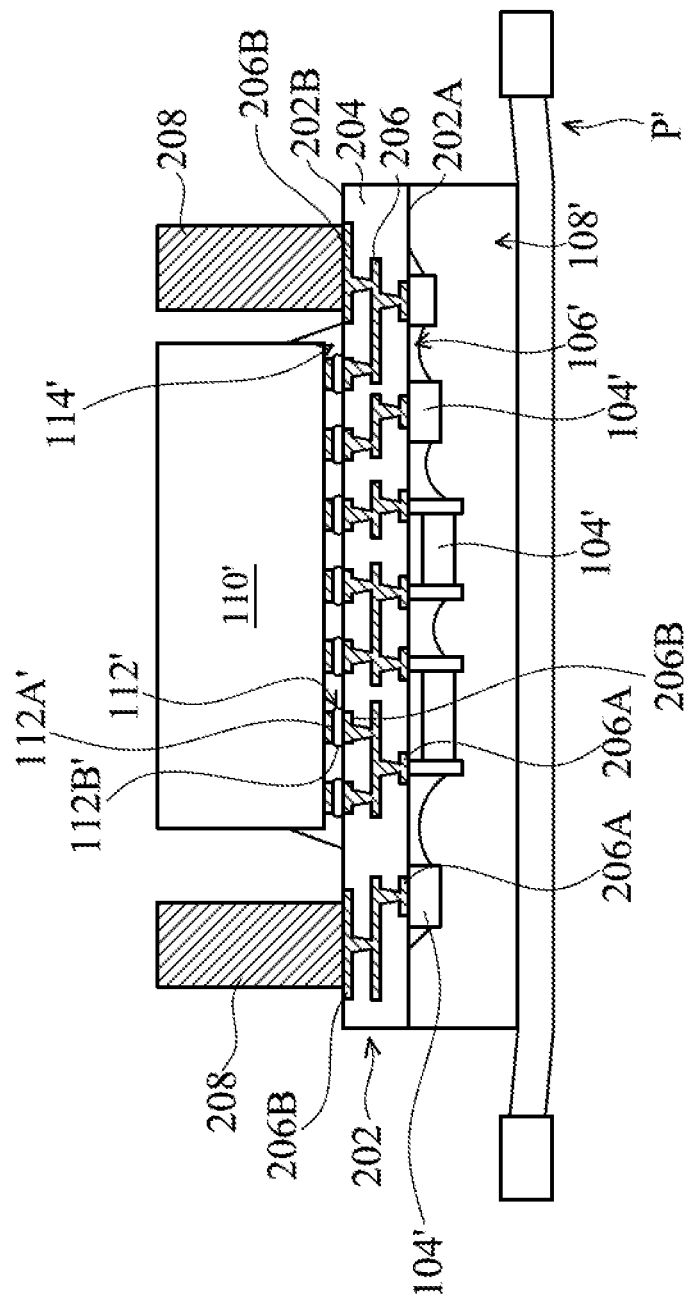

As shown in FIG. 2D, semiconductor dies 110' (for simplicity, only one semiconductor die 110' is depicted) are stacked over the surface 202B of the package substrate 202, in accordance with some embodiments. The semiconductor dies 110' may be the same as or similar to the semiconductor dies 110 illustrated in FIG. 1D, and are not repeated here. The semiconductor dies 110' may be placed over the surface 202B using, for example, a pick-and-place tool (not shown). In some embodiments shown in FIG. 2D, the semiconductor die 110' is wider than each of the integrated devices 104', and extends laterally across two or more integrated devices 104'. In some embodiments, conductive pillars 208 are arranged adjacent to the periphery of the semiconductor die 110'.

In some embodiments, each semiconductor die 110' is bonded to (i.e., electrically interconnected to) the contact pads 206B exposed at the surface 202B not occupied by the conductive pillars 208 through conductive connectors 112', as shown in FIG. 2D. In some embodiments, each of the conductive connectors 112' includes a metal pillar 112A' and a metal cap layer (such as a solder cap) 112B' over the metal pillar 112A'. The conductive connectors 112' including the metal pillars 112A' and the metal cap layers 112B' are sometimes referred to as micro bumps. The conductive connectors 112' may be formed on the active surface (such as the lower surface in FIG. 2D) of the semiconductor die 110' at the exposed contact pads (not shown) before bonding. The materials and formation method of the conductive connectors 112' may be the same as or similar to those of the conductive connectors 112 illustrated in FIG. 1D, and are not repeated here. One of ordinary skill in the art would appreciate that the above conductive connectors 112' examples are provided for illustrative purposes, and other structures of the conductive connectors 112' may also be used.

The bonding between the semiconductor die 110' and the package substrate 202 may be solder bonding or direct metal-to-metal (such as a copper-to-copper) bonding. In accordance with some embodiments, the semiconductor die 110' is bonded to the package substrate 202 through a reflow process. During the reflow, conductive joints (such as the conductive connectors 112') are in contact with the exposed contact pads (not shown) of the semiconductor die 110' and the exposed contact pads 206B on the surface 202B of the package substrate 202, respectively, to physically and electrically couple the semiconductor die 110' to the package substrate 202.

As shown in FIG. 2D, an underfill element 114' is formed over the surface 202B of the package substrate 202 to surround and protect the semiconductor die 110' and the conductive connectors 112' thereunder, and enhances the connection between the semiconductor die 110' and the package substrate 102', in accordance with some embodiments. In some embodiments, a portion of the underfill element 114' is between the surface 202B and the active surface of the semiconductor die 110' and fills the gap between adjacent conductive connectors 112', to reinforce the strength of the conductive connectors 112' and therefore the overall package structure. The materials and formation method of the underfill element 114' may be the same as or similar to those of the underfill element 106' illustrated in FIG. 2B (as well as the underfill element 106 illustrated in FIG. 1B), and are not repeated here.

Figure 2E:
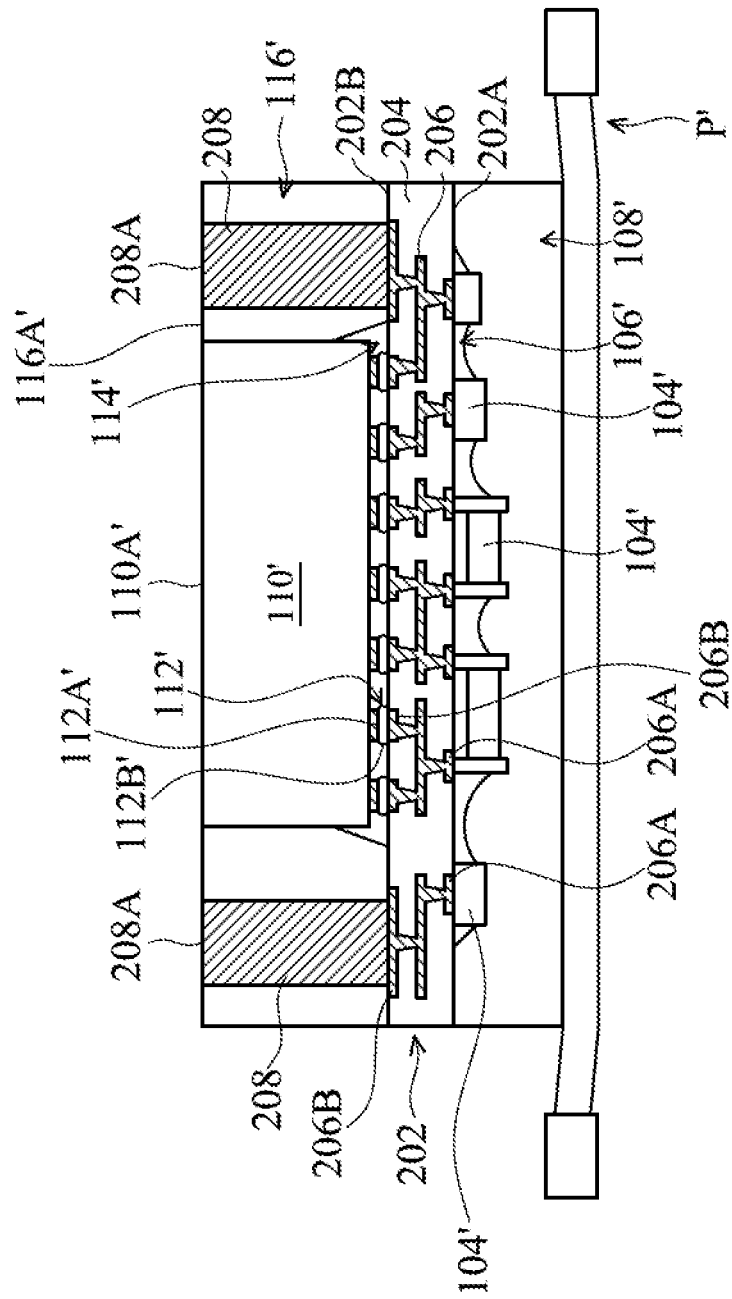

As shown in FIG. 2E, a molding layer 116' is formed over the surface 202B of the package substrate 202 to encapsulate and protect the semiconductor die 110' and the underfill element 114', in accordance with some embodiments. The molding layer 116' may be separated from the conductive connectors 112' below the semiconductor die 110' by the underfill element 114'. In some embodiments, the molding layer 116' also surrounds and protects the conductive pillars 208. The materials and formation method of the molding layer 116' may be the same as or similar to those of the molding layer 108' illustrated in FIG. 2B (as well as the molding layer 108 illustrated in FIG. 1C), and are not repeated here. In some embodiments, the molding layer 116' extends laterally to the lateral edges of the package substrate 202, and the lateral edges of the package substrate 202, the molding layer 108', and the molding layer 116' are aligned.

In some embodiments, the underfill element 114' and the molding layer 116' have different thermal and mechanical properties, such as by having different compositions of material. Each of the underfill element 114' and the molding layer 116' can be modified to have particular mechanical and/or thermal properties by adjusting the ratio of filler to epoxy in the respective material used, for example. The filler may be an inorganic material, such as alumina, silica, or the like.

In some embodiments, the underfill element 114' can be relatively compliant for relieving thermal stress, and the molding layer 116' can have a higher thermal conductivity for heat dissipation. In some embodiments, the molding layer 116' has a lower coefficient of thermal expansion than the underfill element 114', a higher Young's modulus than the underfill element 114', a higher filler content percentage than the underfill element 114', or a combination thereof. The values of CTE, Young's modulus, and filler content of the underfill element 114' and the molding layer 116' may be the same as or similar to those of the underfill element 106 and the molding layer 108 described above in some cases, and are not repeated here. However, other values may also be used. In some embodiments, similar to the underfill element 106 previously discussed, the underfill element 114' can further relieve the thermal stress that occurs as a stress or strain on the conductive joints (e.g., conductive connectors 112') during the molding process of the molding layer 116', for example. As a result, the warpage on the package substrate 202 is reduced, cracks in the semiconductor die 110' are avoided, and delamination at the bonding interface (such as between the semiconductor die 110' and the conductive connectors 112' and/or between the package substrate 202 and the conductive connectors 112') is avoided.

In some embodiments, a planarization process is further applied on the molding layer 116' to partially remove the molding layer 116', until the top surface 110A' of the semiconductor die 110' is exposed through the molding layer 116' (for example, the top surface 110A' is substantially flush with the top surface 116A' of the molding layer 116'), as shown in FIG. 2E. This facilitates the dissipation of heat generated from the semiconductor die 110' during operation. However, the semiconductor die 110' may also be buried or encapsulated in the molding layer 116' after the planarization process, in some other embodiments. In some embodiments shown in FIG. 2E, the top surfaces 208A of the conductive pillars 208 are also exposed through the molding layer 116' (for example. the top surfaces 208A are substantially flush with the top surface 116A' of the molding layer 116' and/or the top surface 110A' of the semiconductor die 110') after the planarization process. The planarization process may include a grinding process, a chemical mechanical polishing (CMP) process, an etching process, a dry polishing process, one or more other applicable processes, or a combination thereof.

Figure 2F:
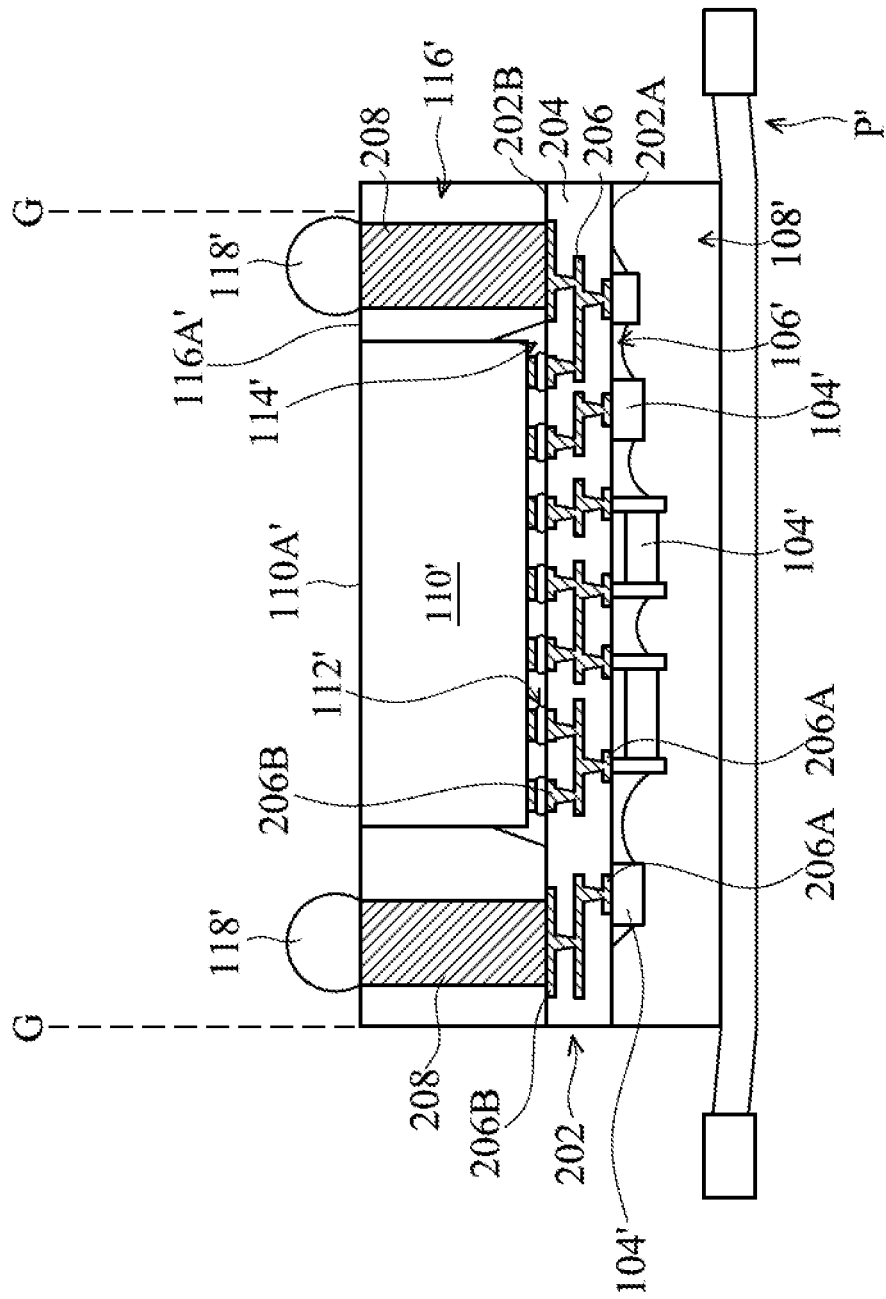

In some embodiments, solder balls (or solder elements) are then disposed on (such as in direct contact with) the top surfaces 208A (see FIG. 2E) of the exposed conductive pillars 208, as shown in FIG. 2F. A reflow process is then carried out to melt the solder balls into the conductive bumps 118'. In some embodiments, the conductive pillars 208 formed in and penetrating the molding layer 116' (sometimes also called through molding vias (TMVs)) electrically couple the conductive bumps 118' to the package substrate 202. The exposed conductive bumps 118' (sometimes also called ball grid array (BGA)) allow the semiconductor package structure to be bonded and electrically connected to an external PCB or other electronic devices (not shown), in accordance with some embodiments.

Figure 2G:
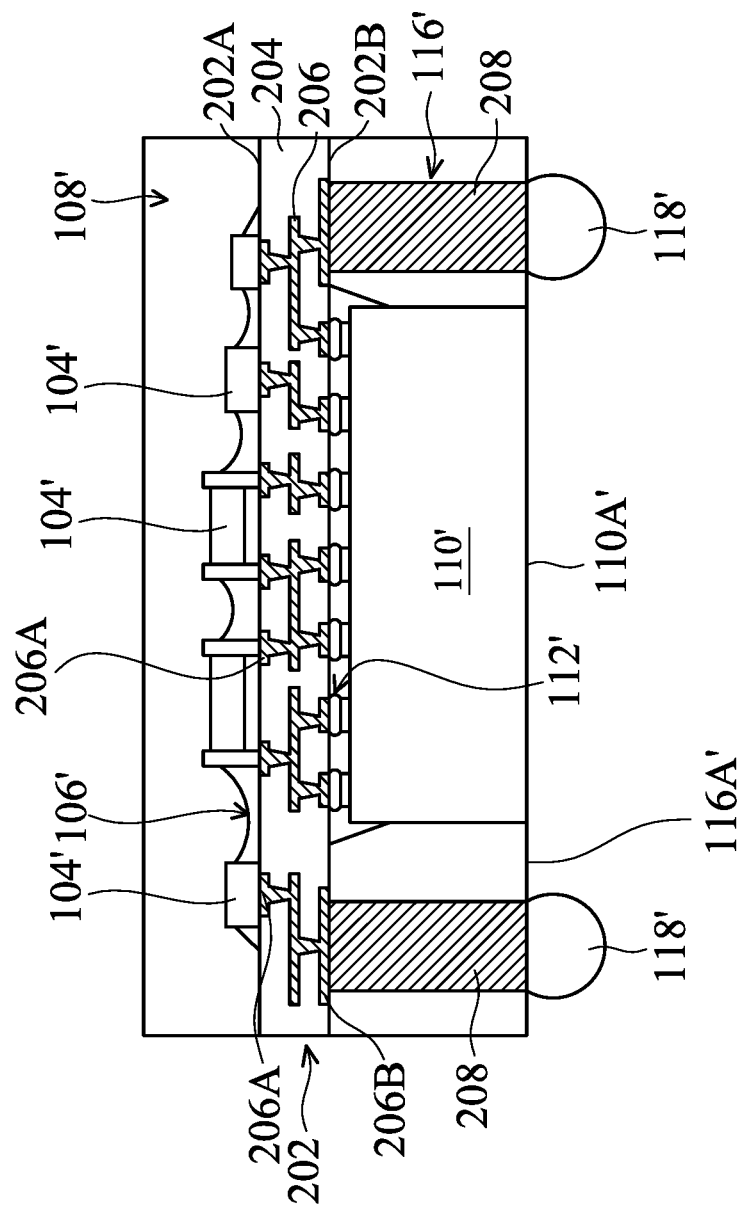

Afterwards, a singulation process (also referred to as a saw process) is performed along cutting grooves G shown in FIG. 2F, to form multiple separate package structures, in accordance with some embodiments. In FIG. 2F, one of the package structures is shown. Each package structure may be removed from the dicing tape P' using, for example, a pick-and-place tool (not shown). FIG. 2G illustrates the resulting semiconductor device package after the processes shown in FIGS. 2A to 2F. In FIG. 2G, underfill elements 106' and 114' are formed on both sides of the package substrate 202 to relieve the thermal stress generated during the molding processes of the molding layers 108' and 116', as described above. Accordingly, the warpage on the package substrate 202 and/or the semiconductor die 110' is reduced, and delamination at the bonding interface between the package substrate 202 and the devices packaged thereon is also avoided. Consequently, the reliability of the entire package structure is improved.

Figure 3:
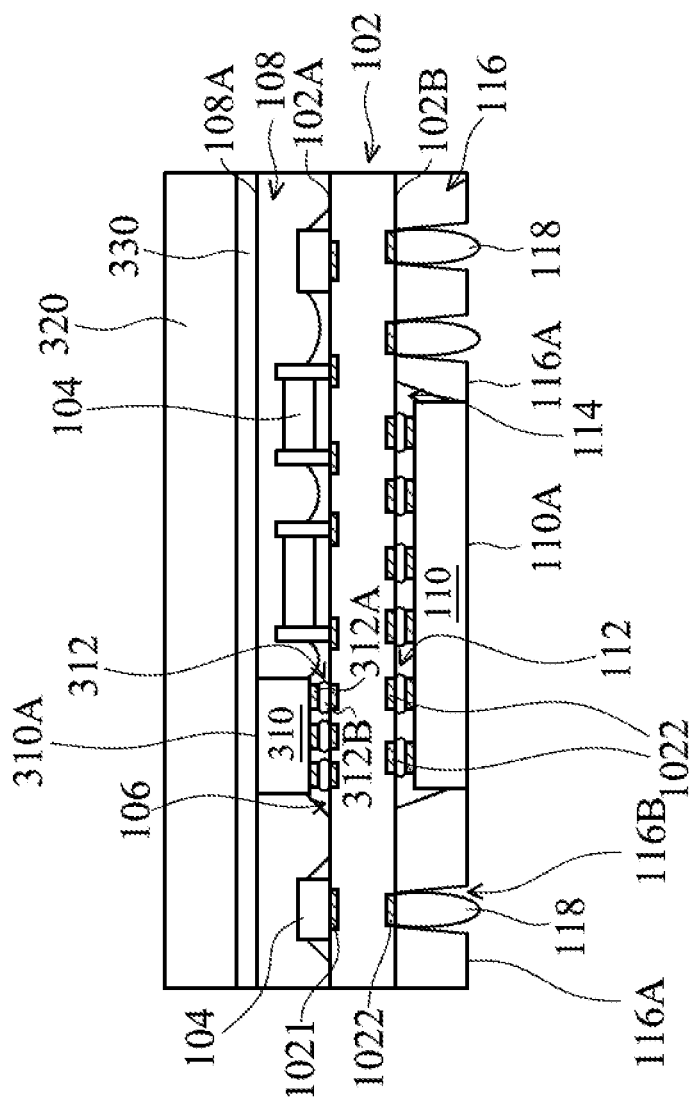
FIG. 3 is a cross-sectional view of a semiconductor device package in accordance with some embodiments.

Many variations and/or modifications can be made to embodiments of the disclosure. FIG. 3 is across-sectional view of a semiconductor device package in accordance with some embodiments. It should be appreciated that most of the structures in FIG. 3 are the same as those in FIG. 1G, so only the different parts are described here. In FIG. 3, there is an additional semiconductor die 310 mounted on the surface 102A of the package substrate 102. In some embodiments, the semiconductor die 310 and the semiconductor die 110 over the surface 102B of the package substrate 102 may be the same or different types of electronic components. For example, the semiconductor die 110 is a processor die and the semiconductor die 310 is a memory die, but other combinations may also be used.

In some embodiments, the semiconductor die 310 is bonded to (i.e., electrically interconnected to) the surface 102A through conductive connectors 312, as shown in FIG. 3. In some embodiments, each of the conductive connectors 312 includes a metal pillar 312A and a metal cap layer (such as a solder cap) 312B over the metal pillar 312A, similar to the structure of the conductive connectors 112 illustrated in FIG. 1D. The semiconductor die 310 may be bonded to the package substrate 102 using the conductive connectors 312 before the formation of the underfill element 106 and the molding layer 108 described above. In some embodiments shown in FIG. 3, the underfill element 106 after formed also surround and protect the semiconductor die 310 and the conductive connectors 312 thereunder, and enhances the connection between the semiconductor die 310 and the package substrate 102. The molding layer 108 after formed also encapsulates and protects semiconductor die 310, and may be separated from the conductive connectors 312 below the semiconductor die 310 by the underfill element 106.

As shown in FIG. 3, the semiconductor die 310 is exposed through the molding layer 108 (for example, the top surface 310A of the semiconductor die 310 is substantially flush with the top surface 108A of the molding layer 108) after the planarization process (e.g., described in FIG. 1C), in accordance with some embodiments. In FIG. 3, the semiconductor device package further includes a lid structure 320, which may also be a heat spreader, attached to the top surface 108A of the molding layer 108 and the top surface 310A of the semiconductor die 310 using a thermal interface material 330, in accordance with some embodiments. The lid structure 320 in this embodiment is planar, but embodiments of the disclosure is not limited thereto. In different embodiments, the lid structure 320 may be a ring or other applicable structure. The materials of the lid structure 320 may include copper, steel, stainless steel, the like, or a combination thereof. The thermal interface material 330 may be a thermally conductive and electrically insulating material, such as an epoxy, an epoxy mixed with a metal like silver or gold, a "thermal grease", a "white grease", the like, or a combination thereof. The thermal interface material 330 may be dispensed on the top surface 108A of the molding layer 108 and the top surface 310A of the semiconductor die 310. The lid structure 320 may then be placed, using a pick-and-place tool (not shown), on the thermal interface material 330 to attach the lid structure 320 to the remainder of the package. In some embodiments, the lid structure 320 being rigid can further constrain the underlying package substrate 102 to alleviate the warpage on the package substrate 102 and/or the semiconductor die 310 thereon.

In some other embodiments, the semiconductor die 310 is buried or encapsulated in the molding layer 108 (i.e., not exposed) after the planarization process, and/or the lid structure 320 and the thermal interface material 330 can be omitted. It should be appreciated that the semiconductor die 310, the lid structure 320, and the thermal interface material 330 described herein may also be applied to the semiconductor device packages as disclosed in the aforementioned embodiments of FIG. 2G.

Figure 4:
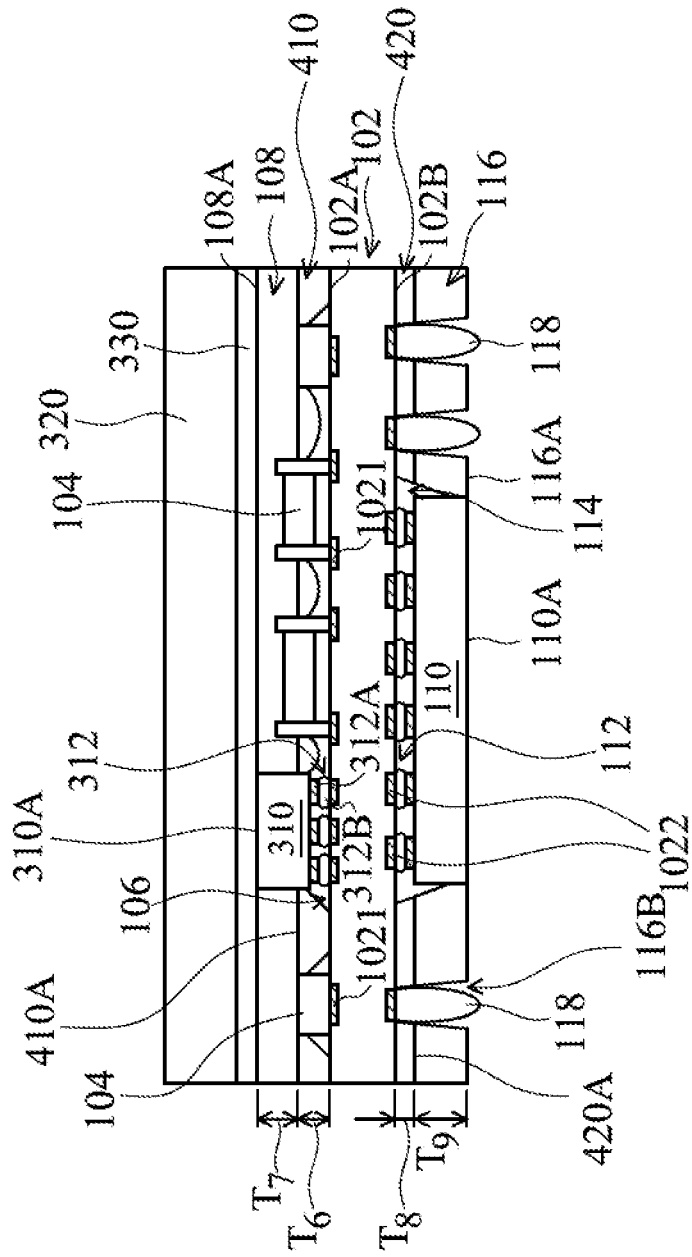
FIG. 4 is a cross-sectional of a semiconductor device package in accordance with some embodiments.

Many variations and/or modifications can be made to embodiments of the disclosure. FIG. 4 is a cross-sectional view of a semiconductor device package in accordance with some embodiments. It should be appreciated that most of the structures in FIG. 4 are the same as those in FIG. 3, so only the different parts are described here. In FIG. 4, there is an additional molding layer 410 over the surface 102A of the package substrate 102, and an additional molding layer 420 over the surface 102B of the package substrate 102.

In some embodiments, the molding layer 410 is disposed between the molding layer 108 and the underfill element 106, and surrounds and protects the semiconductor die 310, the integrated devices 104, and the underfill element 106, as shown in FIG. 4. The molding layer 410 may be applied over the surface 102A using, for example, injection molding or the like, and then be cured. Afterward, the molding layer 108 may be applied over the molding layer 410 using, for example, injection molding or the like, and then be cured. In accordance with some embodiments, each of the molding layer 410 and the molding layer 108 extend laterally to the lateral edges of the package substrate 102, such that respective lateral edges of the package substrate 102, the molding layer 410, and the molding layer 108 are coterminous. In some embodiments shown in FIG. 4, a thickness $T_6$ of the molding layer 410 (such as from the surface 102A to the top surface 410A of the molding layer 410 in a direction perpendicular to the surface 102A) is smaller than a thickness $T_7$ of the molding layer 108 (such as from the top surface 410A of the molding layer 410 to the top surface 108A of the molding layer 108 in the direction perpendicular to the surface 102A), but the thickness $T_6$ can also be equal to or greater than the thickness $T_7$ in different embodiments.

In some embodiments, the molding layer 410 and the molding layer 108 have different thermal and mechanical properties, such as by having different compositions of material. Each of the molding layer 410 and the molding layer 108 can be modified to have particular mechanical and/or thermal properties by adjusting the ratio of filler to epoxy in the respective molding compound, for example. The filler may be an inorganic material, such as alumina, silica, or the like.

In some embodiments, the molding layer 410 can be relatively compliant for relieving thermal stress, and the molding layer 108 can have a higher thermal conductivity for heat dissipation. In some embodiments, the molding layer 108 has a lower coefficient of thermal expansion than the molding layer 410, a higher Young's modulus than the molding layer 410, a higher filler content percentage than the molding layer 410, or a combination thereof. For example, the coefficient of thermal expansion the molding layer 410 is greater than that of the molding layer 108 and lower than that of the underfill element 106; the Young's modulus of the molding layer 410 is smaller than that of the molding layer 108 and greater than that of the underfill element 106; and/or the filler content percentage of the molding layer 410 is lower than that of the molding layer 108 and higher than that of the underfill element 106. Accordingly, the molding layer 410 can also reduce warpage of the package substrate 102 by reducing the CTE mismatch between the package substrate 102 and the components or other materials thereon, in addition to the warpage control by the underfill element 106 described above.

In some embodiments, the molding layer 420 is disposed between the molding layer 116 and the underfill element 114, and surrounds and protects the semiconductor die 110 and the underfill element 114, as shown in FIG. 4. The molding layer 420 may be applied over the surface 102B using, for example, injection molding or the like, and then be cured. Afterward, the molding layer 116 may be applied over the molding layer 420 using, for example, injection molding or the like, and then be cured. In accordance with some embodiments, each of the molding layer 420 and the molding layer 116 extend laterally to the lateral edges of the package substrate 102, such that respective lateral edges of the package substrate 102, the molding layer 420, and the molding layer 116 are coterminous. In some embodiments shown in FIG. 4, a thickness $T_8$ of the molding layer 420 (such as from the surface 102B to the top surface 420A of the molding layer 420 in a direction perpendicular to the surface 102B) is smaller than a thickness $T_9$ of the molding layer 116 (such as from the top surface 420A of the molding layer 420 to the top surface 116A of the molding layer 116), but the thickness $T_8$ can also be equal to or greater than the thickness $T_9$ in different embodiments.

In some embodiments, the molding layer 420 and the molding layer 116 have different thermal and mechanical properties, such as by having different compositions of material. Each of the molding layer 420 and the molding layer 116 can be modified to have particular mechanical and/or thermal properties by adjusting the ratio of filler to epoxy in the respective molding compound, for example. The filler may be an inorganic material, such as alumina, silica, or the like.

In some embodiments, the molding layer 420 can be relatively compliant for relieving thermal stress, and the molding layer 116 can have a higher thermal conductivity for heat dissipation. In some embodiments, the molding layer 116 has a lower coefficient of thermal expansion than the molding layer 420, a higher Young's modulus than the molding layer 420, a higher filler content percentage than the molding layer 420, or a combination thereof. For example, the coefficient of thermal expansion the molding layer 420 is greater than that of the molding layer 116 and lower than that of the underfill element 114; the Young's modulus of the molding layer 420 is smaller than that of the molding layer 116 and greater than that of the underfill element 114; and/or the filler content percentage of the molding layer 420 is lower than that of the molding layer 116 and higher than that of the underfill element 114. Accordingly, the molding layer 420 can also reduce warpage of the package substrate 102 by reducing the CTE mismatch between the package substrate 102 and the components or other materials thereon, in addition to the warpage control by the underfill element 114 described above.

It should be appreciated that the additional molding layers 410 and 420 described herein may also be applied to the semiconductor device packages as disclosed in the aforementioned embodiments of FIGS. 1G and 2G.

Embodiments of the disclosure form a semiconductor device package including a package substrate (e.g., a wiring substrate or a redistribution substrate), a plurality of integrated devices over a first surface of the package substrate, a first molding layer over the first surface and encapsulating the integrated devices, a semiconductor die over a second surface of the package substrate, and a second molding layer over the second surface and encapsulating the semiconductor die. In accordance with some embodiments, the semiconductor device package further includes a first underfill element over the first surface and surrounding the conductive joins between the integrated devices and the package substrate, and a second underfill element over the second surface and surrounding the conductive joints between the semiconductor die and the package substrate. The underfill elements can relieve the thermal stress that occurs as a stress or strain on the conductive joints during high-temperature molding processes, thereby reducing warpage on the package substrate and avoiding delamination at the bonding interface between the packaged devices and the package substrate. Accordingly, the reliability of the semiconductor device package is improved.

In accordance with some embodiments, a semiconductor device package is provided. The semiconductor device package includes a package substrate, multiple integrated devices, a first underfill element, a first molding layer, a semiconductor die, a second underfill element, a second molding layer, and multiple conductive bumps. The package substrate has a first surface and a second surface opposite to the first surface. The integrated devices are bonded to the first surface of the package substrate. The first underfill element is disposed over the first surface and surrounds the integrated devices. The first molding layer is disposed over the first surface and surrounds the integrated devices and the first underfill element. The first molding layer has a different composition than the first underfill element. The semiconductor die is bonded to the second surface of the package substrate. The second underfill element is disposed over the second surface and surrounds the semiconductor die. The second molding layer is disposed over the second surface and surrounds the semiconductor die and the second underfill element. The second molding layer has a different composition than the second underfill element. The conductive bumps are disposed over the second surface and adjacent to the second molding layer.

In accordance with some embodiments, a semiconductor device package is provided. The semiconductor device package includes a package substrate, multiple integrated devices, a first semiconductor die, a first underfill element, a first molding layer, a second semiconductor die, a second underfill element, a second molding layer, and multiple conductive bumps. The package substrate has a first surface and a second surface opposite to the first surface. The first semiconductor die and the integrated devices are bonded to the first surface of the package substrate. The first underfill element is disposed over the first surface and surrounds the first semiconductor die and the integrated devices. The first molding layer is disposed over the first surface and encapsulates the first semiconductor die, the integrated devices, and the first underfill element. The first molding layer has a different composition than the first underfill element. The second semiconductor die is bonded to the second surface of the package substrate. The second underfill element is disposed over the second surface and surrounds the second semiconductor die. The second molding layer is disposed over the second surface and encapsulates the second semiconductor die and the second underfill element. The second molding layer has a different composition than the second underfill element. The conductive bumps are disposed over the second surface and adjacent to the second molding layer.

In accordance with some embodiments, a method for forming a semiconductor device package is provided. The method includes bonding multiple integrated devices to the first surface of a package substrate. The method also includes forming a first underfill element on the first surface to surround the integrated devices. The method also includes forming a first molding layer on the first surface to encapsulate the integrated devices and the first underfill element. The first molding layer has a different composition than the first underfill element. The method further includes bonding a semiconductor die to the second surface of the package substrate opposite to the first surface. The method further includes forming a second underfill element on the second surface to surround the semiconductor die. The method further includes forming a second molding layer on the second surface to encapsulate the semiconductor die and the second underfill element. The second molding layer has a different composition than the second underfill element. In addition, the method includes disposing multiple conductive bumps over the second surface and adjacent to the second molding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device package, comprising:
    bonding a plurality of integrated passive devices to a first surface of a package substrate, wherein the plurality of integrated passive devices comprise a first integrated passive device and a second integrated passive device, and the first integrated passive device is thicker than the second integrated passive device;
    forming a first underfill element on the first surface to surround the plurality of integrated passive devices, wherein a first part of the first underfill element in contact with the first integrated passive device is thicker than a second part of the first underfill element in contact with the second integrated passive device;
    forming a first molding layer on the first surface to encapsulate the plurality of integrated passive devices and the first underfill element, wherein the first molding layer has a different material composition than the first underfill element;
    bonding a semiconductor die to a second surface of the package substrate opposite to the first surface;
    forming a second underfill element on the second surface to surround the semiconductor die;
    forming a second molding layer on the second surface to encapsulate the semiconductor die and the second underfill element, wherein the second molding layer has a different material composition than the second underfill element;
    forming a third molding layer between the first molding layer and the first underfill element to surround the plurality of integrated passive devices and the first underfill element, wherein the third molding layer has a different material composition than the first molding layer and the first underfill element, wherein a coefficient of thermal expansion (CTE) of the third molding layer is greater than that of the first molding layer and lower than that of the first underfill element, and a Young's modulus of the third molding layer is smaller than that of the first molding layer and greater than that of the first underfill element;

forming a fourth molding layer between the second molding layer and second underfill element to surround the semiconductor die and the second underfill element, wherein the fourth molding layer has a different material composition than the second molding layer and the second underfill element, wherein a coefficient of thermal expansion (CTE) of the fourth molding layer is greater than that of the second molding layer and lower than that of the second underfill element, a Young's modulus of the fourth molding layer is smaller than that of the second molding layer and greater than that of the second underfill element;

forming openings in the second molding layer and the fourth molding layer to expose contact pads formed on the second surface of the package substrate; and disposing a plurality of conductive bumps over the second surface and adjacent to the second molding layer and the fourth molding layer, wherein the disposing the plurality of conductive bumps comprises forming the plurality of conductive bumps in the openings to electrically contact the contact pads, wherein the plurality of conductive bumps is in direct contact with the second surface and exposed from the second molding layer, wherein a thickness of each of the plurality of conductive bumps is greater than a total thickness of the second molding layer and the fourth molding layer in a direction perpendicular to the second surface of the package substrate.

2. The method as claimed in claim 1, wherein the first molding layer has a higher filler content percentage than the first underfill element.

3. The method as claimed in claim 1, wherein the second molding layer has a higher filler content percentage than the second underfill element.

4. The method as claimed in claim 1, further comprising:
bonding an additional semiconductor die to the first surface before the formation of the first underfill element and the first molding layer, wherein the formed first underfill element further surrounds the additional semiconductor die, the formed first molding layer further encapsulates the additional semiconductor die, and a surface of the additional semiconductor die is exposed through the first molding layer;
applying a thermal interface material to the surface of the additional semiconductor die; and
attaching a lid structure to the thermal interface material.

5. The method as claimed in claim 1, wherein a filler content percentage of the third molding layer is lower than that of the first molding layer and higher than that of the first underfill element.

6. The method as claimed in claim 1, wherein a filler content percentage of the fourth molding layer is lower than that of the second molding layer and higher than that of the second underfill element.

7. The method as claimed in claim 1, wherein lateral edges of the first molding layer, the third molding layer, and the package substrate are coterminous.

8. The method as claimed in claim 1, wherein lateral edges of the second molding layer, the fourth molding layer, and the package substrate are coterminous.

9. The method as claimed in claim 1, wherein a thickness of the third molding layer is smaller than a thickness of the first molding layer, and a thickness of the fourth molding layer is smaller than a thickness of the second molding layer.

10. A method for forming a semiconductor device package, comprising:
bonding a plurality of integrated passive devices to a first surface of a package substrate, wherein the plurality of integrated passive devices comprise a first integrated passive device and a second integrated passive device, and the first integrated passive device is thicker than the second integrated passive device;

forming a first underfill element on the first surface to surround the plurality of integrated passive devices, wherein the first underfill element extends onto a sidewall of each integrated passive device of the plurality of integrated passive devices, wherein a first part of the first underfill element in contact with the first integrated passive device is thicker than a second part of the first underfill element in contact with the second integrated passive device;

forming a first molding layer on the first surface to encapsulate the plurality of integrated passive devices and the first underfill element, wherein the first molding layer has a different material composition than the first underfill element;

bonding a semiconductor die to a second surface of the package substrate opposite to the first surface;

forming a second underfill element on the second surface to surround the semiconductor die;

forming a second molding layer on the second surface to encapsulate the semiconductor die and the second underfill element, wherein the second molding layer has a different material composition than the second underfill element;

forming a third molding layer between the first molding layer and the first underfill element to surround the integrated passive devices and the first underfill element, wherein the third molding layer has a different material composition than the first molding layer and the first underfill element, wherein a coefficient of thermal expansion (CTE) of the third molding layer is greater than that of the first molding layer and lower than that of the first underfill element, and a Young's modulus of the third molding layer is smaller than that of the first molding layer and greater than that of the first underfill element;

forming a fourth molding layer between the second molding layer and second underfill element to surround the semiconductor die and the second underfill element, wherein the fourth molding layer has a different material composition than the second molding layer and the second underfill element, wherein a coefficient of thermal expansion (CTE) of the fourth molding layer is greater than that of the second molding layer and lower than that of the second underfill element, a Young's modulus of the fourth molding layer is smaller than that of the second molding layer and greater than that of the second underfill element;

forming openings in the second molding layer and the fourth molding layer to expose contact pads formed on the second surface of the package substrate; and forming a plurality of conductive bumps in the openings to electrically contact the contact pads, wherein a thickness of each of the plurality of conductive bumps is greater than a total thickness of the second molding layer and the fourth molding layer in a direction perpendicular to the second surface of the package substrate.

11. The method as claimed in claim 10, wherein the first molding layer has a higher filler content percentage than the first underfill element, and the second molding layer has a higher filler content percentage than the second underfill element.

12. The method as claimed in claim 10, wherein the semiconductor die is wider than each of the integrated passive devices, and extends across two or more of the integrated passive devices.

13. The method as claimed in claim 10, wherein the semiconductor die is bonded to the second surface through a plurality of conductive connectors, and a portion of the second underfill element is between the second surface and a surface of the semiconductor die facing the second surface to surround the plurality of conductive connectors.

14. A method for forming a semiconductor device package, comprising:
bonding a first semiconductor die and a plurality of integrated passive devices to a first surface of a package substrate, wherein the plurality of integrated passive devices comprise a first integrated passive device and a second integrated passive device, and the first integrated passive device is thicker than the second integrated passive device;
forming a first underfill element on the first surface to surround the first semiconductor die and the plurality of integrated passive devices, wherein a first part of the first underfill element in contact with the first integrated passive device is thicker than a second part of the first underfill element in contact with the second integrated passive device;
forming a first molding layer on the first surface to encapsulate the first semiconductor die, the plurality of integrated passive devices and the first underfill element, wherein the first underfill element has a higher coefficient of thermal expansion (CTE) than the first molding layer, and the first molding layer has a higher Young's modulus than the first underfill element;
bonding a second semiconductor die to a second surface of the package substrate opposite to the first surface;
forming a second underfill element on the second surface to surround the second semiconductor die;
forming a second molding layer on the second surface to encapsulate the second semiconductor die and the second underfill element, wherein second underfill element has a higher coefficient of thermal expansion (CTE) than the second molding layer, and the second molding layer has a higher Young's modulus than the second underfill element;
forming a third molding layer between the first molding layer and the first underfill element to surround the first semiconductor die, the plurality of integrated passive devices, and the first underfill element, wherein the third molding layer has a different material composition than the first molding layer and the first underfill element, wherein a coefficient of thermal expansion (CTE) of the third molding layer is greater than that of the first molding layer and lower than that of the first underfill element, and a Young's modulus of the third molding layer is smaller than that of the first molding layer and greater than that of the first underfill element;
forming a fourth molding layer between the second molding layer and second underfill element to surround the second semiconductor die and the second underfill element, wherein the fourth molding layer has a different material composition than the second molding layer and the second underfill element, wherein a coefficient of thermal expansion (CTE) of the fourth molding layer is greater than that of the second molding layer and lower than that of the second underfill element, a Young's modulus of the fourth molding layer is smaller than that of the second molding layer and greater than that of the second underfill element;
forming a plurality of openings in the second molding layer and the fourth molding layer to expose contact pads formed on the second surface of the package substrate; and
disposing a plurality of conductive bumps in the plurality of openings to electrically contact the contact pads, wherein a thickness of each of the plurality of conductive bumps is greater than a total thickness of the second molding layer and the fourth molding layer in a direction perpendicular to the second surface of the package substrate.

15. The method as claimed in claim 14, wherein the first molding layer has a higher filler content percentage than the first underfill element, and the second molding layer has a higher filler content percentage than the second underfill element.

16. The method as claimed in claim 1, wherein the first underfill element extends onto a sidewall of each integrated passive device of the plurality of integrated passive devices, and a thickness of the first underfill element is ⅓ to ½ of a thickness of each integrated passive device of the plurality of integrated passive devices.

17. The method as claimed in claim 1, further comprising:
performing a planarization process on the second molding layer to partially remove the second molding layer until a top surface of the semiconductor die is exposed through the second molding layer.

18. The method as claimed in claim 17, wherein the top surface of the semiconductor die is exposed and flush with a top surface of the second molding layer after the planarization process, and
wherein the openings are formed in the second molding layer and the plurality of conductive bumps is disposed in the openings after the planarization process.

19. The method as claimed in claim 1, wherein the first part and the second part of the first underfill element are connected to each other.

20. The method as claimed in claim 19, wherein a lateral extent of the first underfill element surrounding the plurality of integrated passive devices is greater than a lateral extent of the second underfill element surrounding the semiconductor die.

* * * * *